United States Patent
Holt et al.

(10) Patent No.: US 11,881,395 B2
(45) Date of Patent: Jan. 23, 2024

(54) BIPOLAR TRANSISTOR STRUCTURE ON SEMICONDUCTOR FIN AND METHODS TO FORM SAME

(71) Applicant: GlobalFoundries U.S. Inc., Malta, NY (US)

(72) Inventors: Judson R. Holt, Ballston Lake, NY (US); Hong Yu, Clifton Park, NY (US); Alexander M. Derrickson, Saratoga Springs, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 40 days.

(21) Appl. No.: 17/644,939

(22) Filed: Dec. 17, 2021

(65) Prior Publication Data

US 2023/0062013 A1    Mar. 2, 2023

Related U.S. Application Data

(60) Provisional application No. 63/239,585, filed on Sep. 1, 2021.

(51) Int. Cl.
*H01L 29/735* (2006.01)
*H01L 29/08* (2006.01)
(Continued)

(52) U.S. Cl.
CPC ........ *H01L 29/735* (2013.01); *H01L 29/0808* (2013.01); *H01L 29/0821* (2013.01); *H01L 29/1008* (2013.01); *H01L 29/6625* (2013.01)

(58) Field of Classification Search
CPC . H01L 29/7302; H01L 29/735; H01L 29/737; H01L 29/0808; H01L 29/0821; H01L 29/1008; H01L 29/41708; H01L 29/41716; H01L 29/41725; H01L 29/41775; H01L 29/41783; H01L 27/0623; H01L 27/067; H01L 27/0705; H01L 27/0711; H01L 27/0722; H01L 27/1211;
(Continued)

(56) References Cited

U.S. PATENT DOCUMENTS

| 4,567,645 A | 2/1986 | Cavanagh et al. |
| 6,569,730 B2 | 5/2003 | Tsai et al. |

(Continued)

OTHER PUBLICATIONS

"Bipolar Transistor Structure on Semiconductor Fin and Methods to Form Same," U.S. Appl. No. 63/239,135, filed Aug. 31, 2021, 23 pages.
(Continued)

*Primary Examiner* — Natalia A Gondarenko
(74) *Attorney, Agent, or Firm* — Francois Pagette; Hoffman Warnick LLC

(57) ABSTRACT

Embodiments of the disclosure provide a lateral bipolar transistor on a semiconductor fin and methods to form the same. A bipolar transistor structure according to the disclosure may include a doped semiconductor layer coupled to a base contact. A first semiconductor fin on the doped semiconductor layer may have a first doping type. An emitter/collector (E/C) material may be on a sidewall of an upper portion of the first semiconductor fin. The E/C material has a second doping type opposite the first doping type. The E/C material is coupled to an E/C contact.

20 Claims, 10 Drawing Sheets

(51) Int. Cl.
*H01L 29/66* (2006.01)
*H01L 29/10* (2006.01)

(58) Field of Classification Search
CPC ......... H01L 27/1214–1296; H01L 21/74–746; H01L 21/8249; H01L 21/823418; H01L 21/823814; H01L 29/66234–66348; H01L 29/66575–66598; H01L 29/6625; H01L 29/66931; H01L 29/66795; H01L 29/73–7378; H01L 29/7398; H01L 29/732; H01L 29/063; H01L 29/0649; H01L 29/6656; H01L 29/0673; H01L 29/161; H01L 29/0847; H01L 29/2003; H01L 29/205; H01L 29/207; H01L 29/66242; H01L 29/66439; H01L 29/66484; H01L 29/66886; H01L 29/7831; H01L 29/7832; H01L 29/78645; H01L 29/78648; H01L 27/0259; H01L 27/0229; H01L 27/0274; H01L 27/0277; H01L 27/0647; H01L 27/0288; H01L 27/075; H01L 27/0783; H01L 27/1207; H01L 21/02532; H01L 21/0254; H01L 21/02546; H01L 21/02595; H01L 21/26513; H01L 21/26546; H01L 21/26586; H01L 21/30612; H01L 21/3081; H01L 21/6835; H01L 21/8222; H01L 21/8248; H01L 21/84
USPC ....... 257/586, 526, 565, 306, 355, 133, 141, 257/197, 368; 438/359, 433
See application file for complete search history.

(56) References Cited

U.S. PATENT DOCUMENTS

| | | | |
|---|---|---|---|
| 7,485,537 | B2 | 2/2009 | Ho et al. |
| 8,258,602 | B2* | 9/2012 | Ke .......................... H01L 29/73 |
| | | | 257/E29.174 |
| 8,703,571 | B2 | 4/2014 | Ke et al. |
| 9,209,095 | B2 | 12/2015 | Chang et al. |
| 9,514,998 | B1 | 12/2016 | Basker et al. |
| 9,673,307 | B1* | 6/2017 | Chan ................... H01L 21/6835 |
| 10,217,853 | B1 | 2/2019 | Pan |
| 10,468,498 | B2 | 11/2019 | Kim et al. |
| 10,741,645 | B2 | 8/2020 | Balakrishnan et al. |
| 2011/0147892 | A1 | 6/2011 | Chiu et al. |
| 2013/0328162 | A1* | 12/2013 | Hu ....................... H01L 27/0635 |
| | | | 257/E29.174 |
| 2014/0367745 | A1 | 12/2014 | Cheng et al. |
| 2015/0287650 | A1 | 10/2015 | Chang et al. |
| 2017/0062564 | A1* | 3/2017 | Zhou ................. H01L 21/76895 |
| 2018/0269289 | A1* | 9/2018 | Balakrishnan ........ H01L 29/735 |
| 2019/0312126 | A1 | 10/2019 | Shiu et al. |
| 2021/0091180 | A1 | 3/2021 | Pekarik et al. |
| 2021/0193836 | A1 | 6/2021 | Guha et al. |
| 2021/0296309 | A1 | 9/2021 | Chang et al. |
| 2023/0062013 | A1 | 3/2023 | Holt et al. |
| 2023/0098557 | A1 | 3/2023 | Yu et al. |

OTHER PUBLICATIONS

"Bipolar Transistor Structure on Semiconductor Fin and Methods to Form Same," U.S. Appl. No. 63/261,791, filed Sep. 29, 2021, 27 pages.

European Search Report for corresponding Ep Application No. 22 19 8237 dated Jan. 16, 2023, 10 pages.

Response to Office Action for U.S. Appl. No. 17/578,687, filed Jun. 16, 2023, 9 pages.

U.S. Appl. No. 17/644,939 Final Office Action dated Aug. 25, 2023, 25 pages.

U.S. Appl. No. 63/239,135, filed Aug. 31, 2021, 31 pages.

U.S. Appl. No. 17/644,939, Application filed Dec. 17, 2021, 145 pages.

U.S. Appl. No. 17/644,939, Restriction Requirement dated May 12, 2023, 6 pages.

U.S. Appl. No. 17/644,939, Response to Restriction Requirement filed Dec. 17, 2021, 7 pages.

U.S. Appl. No. 17/644,939, Office Action dated Jun. 20, 2023, 29 pages.

U.S. Appl. No. 17/644,939, Amendment to Office Action filed Jun. 29, 2023, 13 pages.

U.S. Appl. No. 17/578,687, Office Action dated Mar. 16, 2023, 23 pages.

U.S. Appl. No. 17/578,687, Response to Office Action filed Jun. 16, 2023, 9 pages.

U.S. Appl. No. 17/578,687, Notice of Allowance dated Jul. 11, 2023, 9 pages.

U.S. Appl. No. 63/239,135, Provisional Application filed Aug. 31, 2021, 31 pages.

U.S. Appl. No. 63/261,791, Provisional Application filed Sep. 29, 2021, 47 pages.

GF2022160-US-NP_Application_01-19-22.

* cited by examiner

BIPOLAR TRANSISTOR STRUCTURE ON SEMICONDUCTOR FIN AND METHODS TO FORM SAME

BACKGROUND

The present disclosure relates to bipolar transistors. Present technology is at atomic level scaling of certain microdevices such as logic gates, bipolar transistors, field effect transistors (FETs), and capacitors. Circuit chips with millions of such devices are common. The structure of a bipolar transistor defines several of its properties during operation. Conventional integrated circuits may employ vertical bipolar transistors or other types of bipolar transistors, but these types of devices may have higher costs and/or operational parameters that do not meet certain constraints. Improving the electrical behavior of a bipolar transistor may provide related improvements in a device. Some bipolar transistors, such as lateral bipolar transistors, may require significant process accommodations to be integrated into desired locations of a device structure. Such process accommodations may include, e.g., doping and shaping of semiconductor regions in different ways depending on the nature of the device(s) to be formed. Integrating bipolar transistors into a structure with various kinds of FETs may present technical challenges if the different kinds of transistors require distinct types of processing.

SUMMARY

The illustrative aspects of the present disclosure are designed to solve the problems herein described and/or other problems not discussed.

Embodiments of the disclosure provide a bipolar transistor structure including: a doped semiconductor layer coupled to a base contact; a first semiconductor fin on the doped semiconductor layer, the first semiconductor fin having a first doping type; and an emitter/collector (E/C) material on a sidewall of an upper portion of the first semiconductor fin, the E/C material having a second doping type opposite the first doping type, wherein the E/C material is coupled to an E/C contact.

Additional embodiments of the disclosure provide a bipolar transistor structure including: a doped semiconductor layer on a substrate; a first semiconductor fin on the doped semiconductor layer, the first semiconductor fin including: a lower portion on the doped semiconductor layer, the lower portion having a first dopant concentration, and an upper portion on the lower portion, the upper portion having a second dopant concentration that is less than the first dopant concentration; an emitter/collector (E/C) material on a sidewall of the upper portion of the first semiconductor fin; an E/C contact on the E/C material; a second semiconductor fin on the doped semiconductor layer, wherein the second semiconductor fin has a same doping type as the doped semiconductor layer; and a base contact on the second semiconductor fin.

Further embodiments of the disclosure provide a method of forming a bipolar transistor structure, the method including: forming a doped semiconductor layer on a substrate; forming a first semiconductor fin on the doped semiconductor layer, the first semiconductor fin having a first doping type; and forming an emitter/collector (E/C) material on a sidewall of an upper portion of the first semiconductor fin, the E/C material having a second doping type opposite the first doping type, wherein the E/C material is coupled to an E/C contact.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
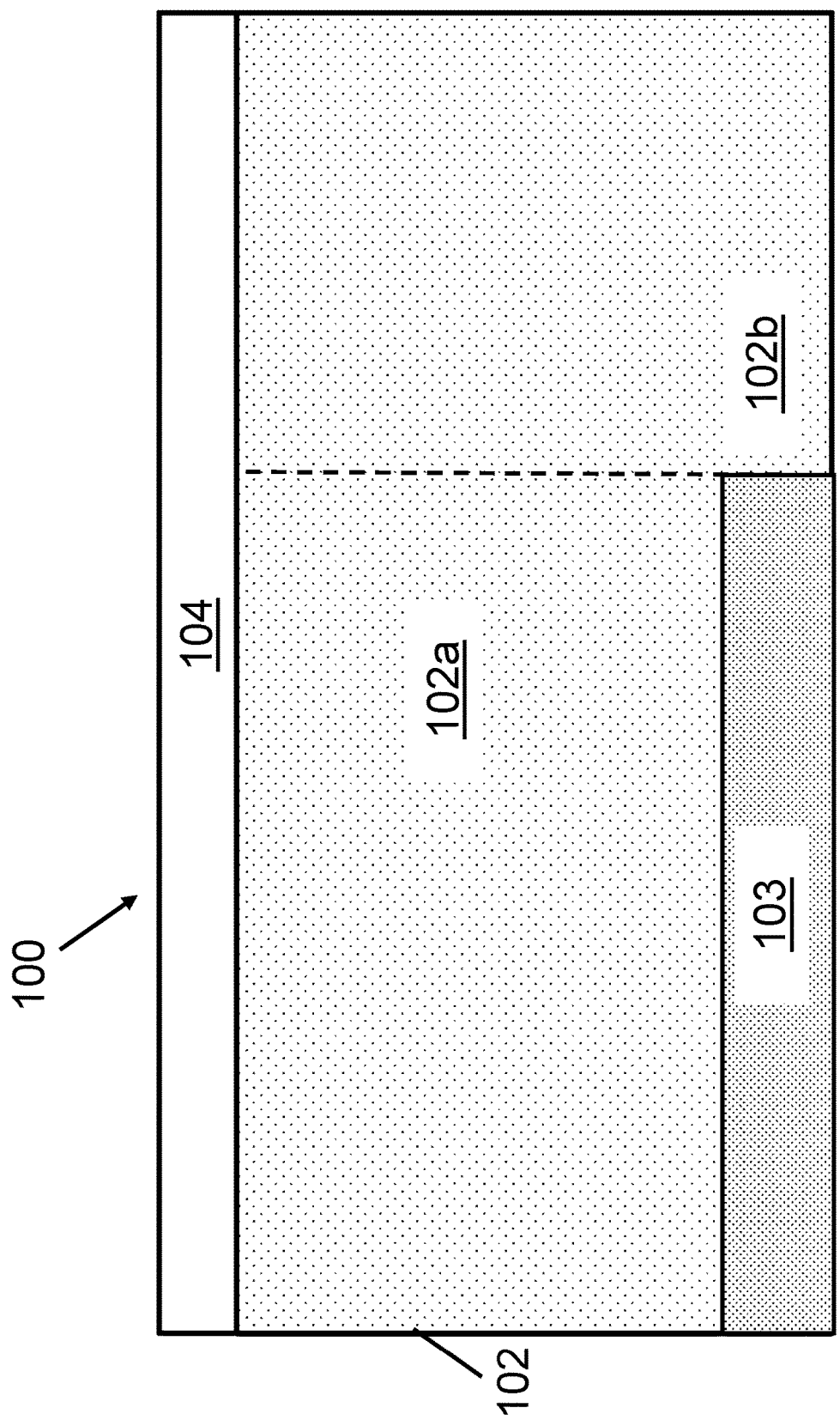
FIG. 1 provides a cross-sectional view of an initial structure to be processed according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a bipolar transistor structure formed on a semiconductor fin, e.g., for integration with conventional fin-type field effect transistors (FinFETs) and/or other devices formed on similar substrate material(s). A bipolar transistor structure according to the disclosure may include a doped semiconductor layer, e.g., defined within the upper portion(s) of a semiconductor substrate. The doped semiconductor layer may be coupled to a base contact, e.g., directly, through a laterally displaced semiconductor material (e.g., a distinct semiconductor fin), or any other conceivable coupling structure/mechanism. A semiconductor fin may be on the doped semiconductor layer and has a particular doping type such as P-type or N-type doping. Such doping may be the same type as the doped semiconductor layer. In some cases, an upper portion of the semiconductor fin may be less highly doped than lower portions of the semiconductor fin to define an intrinsic base region over an extrinsic base region. An emitter/collector (E/C) material may be on a sidewall of an upper portion of the semiconductor fin. The E/C material may be of opposite doping type relative to the semiconductor fin (e.g., N-type when the semiconductor fin is doped P-type or vice versa). The E/C material may be coupled to an E/C contact to define emitter and collector terminals alongside the semiconductor fin. Other fins on the same substrate may be processed differently, e.g., to define FinFET transistors or other complementary metal oxide semiconductor (CMOS) devices.

Bipolar junction transistor (BJT) structures, such as those in embodiments of the disclosure, operate using multiple "P-N junctions." The term "P-N" refers to two adjacent materials having different types of conductivity (i.e., P-type and N-type), which may be induced through dopants within the adjacent material(s). A P-N junction, when formed in a device, may operate as a diode. A diode is a two-terminal element, which behaves differently from conductive or insulative materials between two points of electrical contact. Specifically, a diode provides high conductivity from one contact to the other in one voltage bias direction (i.e., the "forward" direction), but provides little to no conductivity in the opposite direction (i.e., the "reverse" direction). In the case of the P-N junction, the orientation of a diode's forward and reverse directions may be contingent on the type and magnitude of bias applied to the material composition of one or both terminals, which affect the size of the potential barrier. In the case of a junction between two semiconductor materials, the potential barrier will be formed along the physical interface between the two semiconductor materials.

Referring to FIG. 1, a preliminary structure 100 (simply "structure" hereafter) suitable to form a bipolar transistor structure according to embodiments of the disclosure is shown. Preliminary structure 100 may be processed as described herein to yield one or more bipolar transistor structures. However, it is understood that other techniques, ordering of processes, etc., may be implemented to yield the same bipolar transistor structure(s) or similar bipolar transistor structures in further embodiments. FIG. 1 shows a cross-sectional view of structure 100 with a substrate 102 including, e.g., one or more semiconductor materials. Substrate 102 may include but is not limited to silicon, germanium, silicon germanium (SiGe), silicon carbide, or any other common IC semiconductor substrates. In the case of SiGe, the germanium concentration in substrate 102 may differ from other SiGe-based structures described herein. A portion or entirety of substrate 102 may be strained. Substrate 102 may be subdivided into, e.g., a bipolar transistor site 102a and a complementary metal oxide (CMOS) site 102b targeted for the forming of different types of devices. Sites 102a, 102b may be structurally indistinguishable from each other within substrate 102, and the boundary between sites 102a, 102b of substrate 102 may be arbitrary. A dotted line is shown between sites 102a, 102b to indicate locations where different devices are implemented. Substrate 102 may include (e.g., in bipolar site 102a or possibly throughout) a deep well 103 having a predetermined doping type. The doping of deep well 103 may be opposite any initial doping polarity of substrate 102, e.g., deep well 103 may be doped n-type in the case where substrate 102 is doped p-type. Deep well 103 may be used in the eventual bipolar transistor to define a triple well stack, as discussed herein. In some cases, deep well 103 may be omitted entirely.

Structure 100 may include embedded elements for electrically separating active materials formed over substrate 102 from other regions and/or materials. An insulator layer 104 optionally may be formed over sites 102a, 102b of substrate 102, e.g., by forming a layer of dielectric material (e.g., oxide or nitride insulative material), converting silicon material within substrate 102 into a higher-resistive material such as polycrystalline or amorphous silicon (poly-Si), or other techniques. As examples, insulator layer 104 may include: silicon nitride ($Si_3N_4$), silicon oxide ($SiO_2$), fluorinated $SiO_2$ (FSG), hydrogenated silicon oxycarbide (Si-COH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Figure 2:
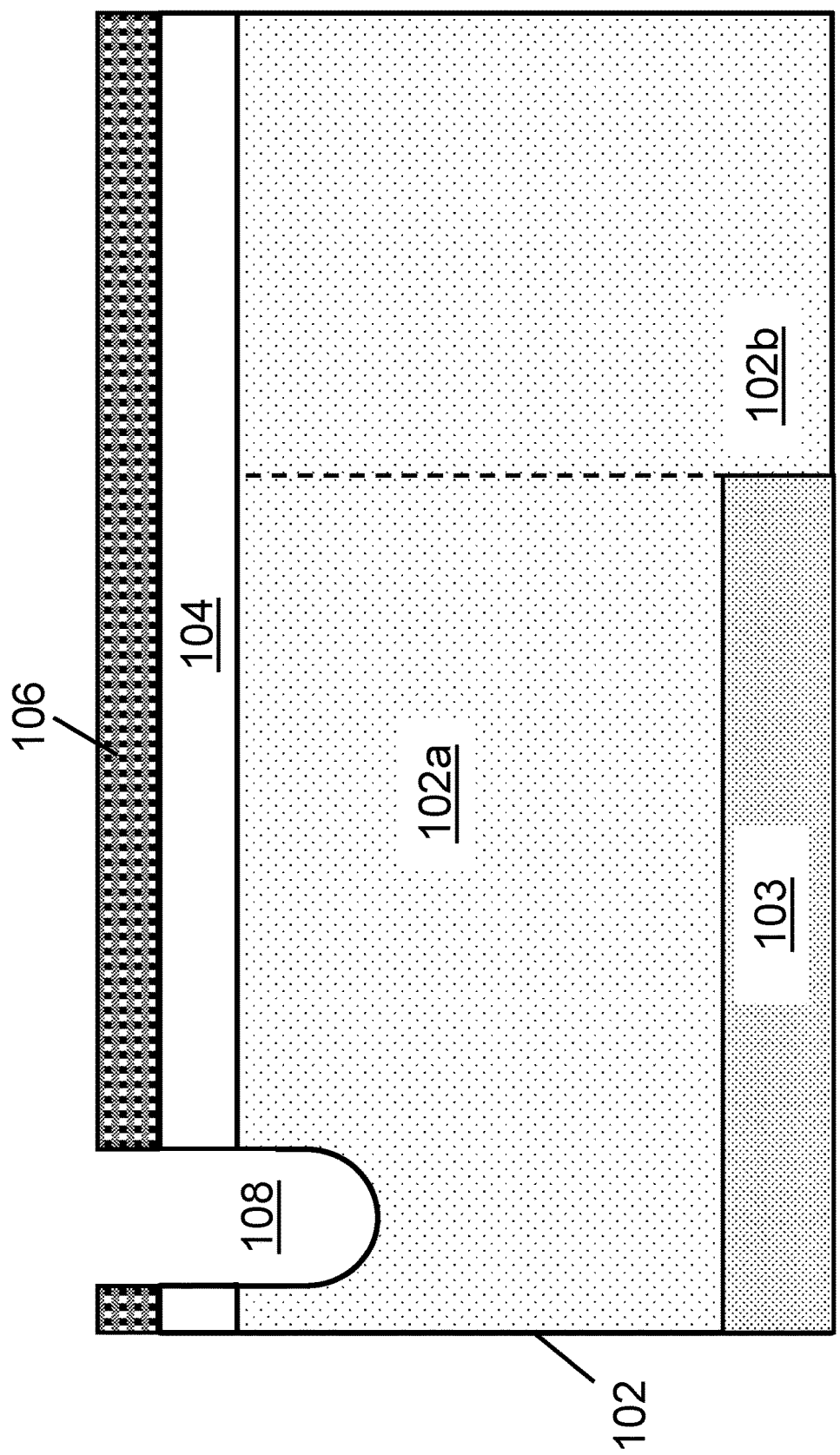
FIG. 2 depicts a cross-sectional view of forming an opening in a bipolar transistor site of a substrate according to embodiments of the disclosure.

Turning to FIG. 2 embodiments of the disclosure may include removing portions of substrate 102 (e.g., at bipolar transistor site 102a) and insulative layer 104 using a mask 106 to form an opening 108 within substrate 102. This removal process may include, for example, mask 106 patterned to expose selected portion(s) of substrate 102 and/or insulator layer 104. Mask 106 may include any now known or later developed appropriate masking material, e.g., a nitride hard mask. As shown in FIG. 2, any appropriate etching process, e.g., reactive ion etching (RIE), can remove a portion of insulative layer 104 to expose substrate 102. Continued removal (e.g., via etching) may also remove portions of bipolar transistor site 102a to a predetermined depth to define opening 108 therein. As discussed herein, forming opening 108 allows semiconductor fins of varying doping polarity to be formed in other processes.

Figure 3:
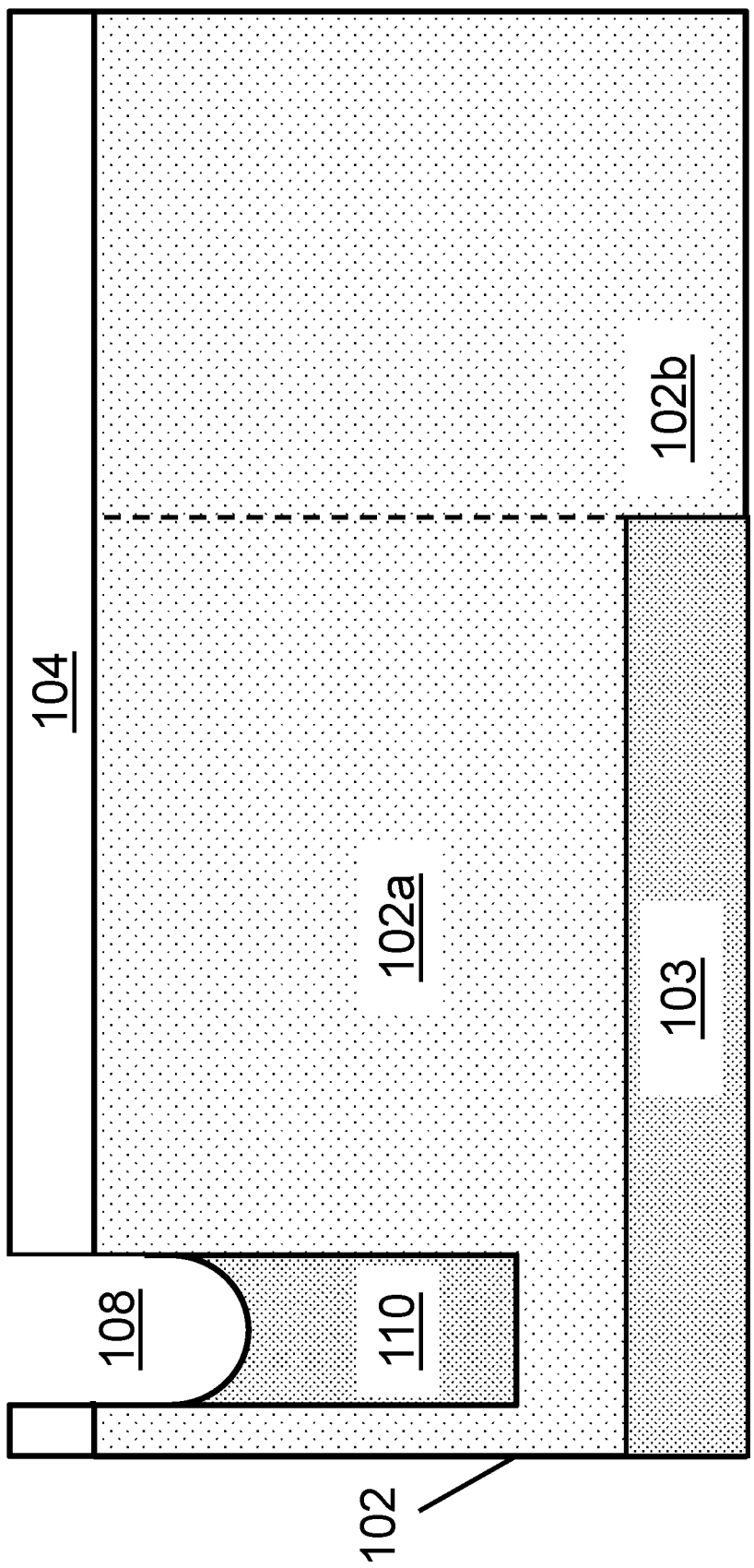
FIG. 3 depicts a cross-sectional view of doping of substrate material within the opening according to embodiments of the disclosure.

FIG. 3 depicts removing mask 106 (FIG. 2) and forming a first doped semiconductor layer 110 within substrate 102, e.g., by any currently known or later developed process to introduce dopant into a semiconductor material. In further implementations, some portions of substrate 102 below opening 108 may be removed and replaced with pre-doped semiconductor material(s) to form first doped semiconductor layer 110. First doped semiconductor layer 110 thus may include any currently known or later developed semiconductor material (e.g., any of those described herein regarding substrate 102) and dopants of any plurality and to any desired concentration. First doped semiconductor layer 110 thus may have a predetermined doping type, e.g., by being doped in-situ or during formation of first doped semiconductor layer 110. In some cases, substrate 102 may include bulk silicon while first doped semiconductor layer 110 may include silicon germanium (SiGe). According to an example, substrate 102 may be undoped or only lightly doped, while first doped semiconductor layer 110 may be more highly doped, for example, N type, to provide active semiconductor material for use in the base terminal of an eventual bipolar transistor structure. Regardless of the composition of first doped semiconductor layer 110, a portion of opening 108 may remain free of material(s) therein, such that first doped semiconductor layer 110 only fills a portion of opening 108. Where doped semiconductor layer 110 is formed by implanting dopants into substrate 102, the forming of semiconductor layer 110 may not change the size of opening 108.

Figure 4:
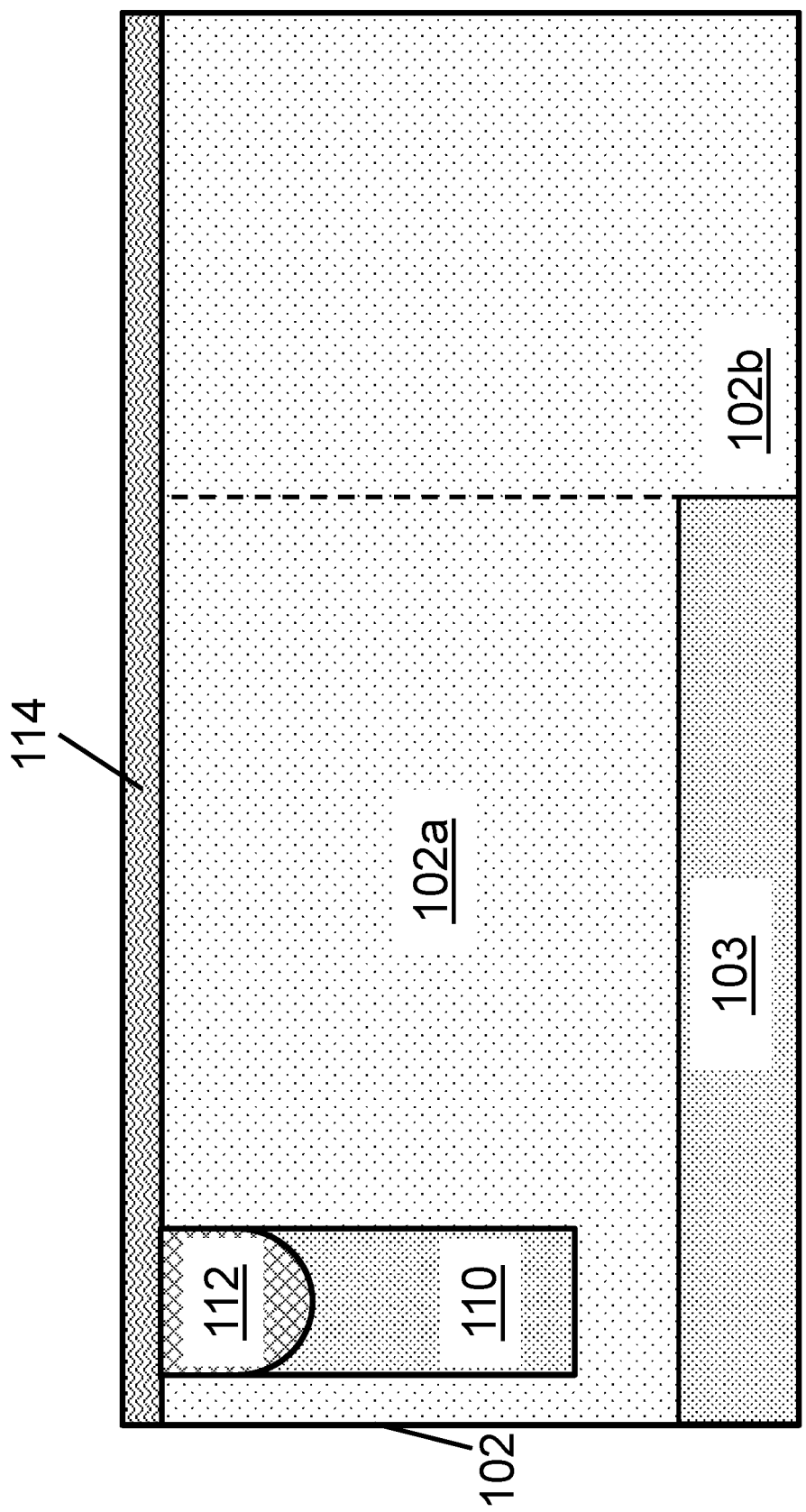
FIG. 4 depicts a cross-sectional view of forming a pad insulator according to embodiments of the disclosure.

FIG. 4 depicts forming a second doped semiconductor layer 112 within the remainder of opening 108, and optionally, replacing insulator layer 104 with a pad insulator 114. Second doped semiconductor layer 112 may be formed with a higher concentration of dopants than first doped semiconductor layer 110 thereunder, e.g., by epitaxially growing additional semiconductor material (e.g., SiGe) on first doped semiconductor layer 110 and with a higher concentration of dopants therein. In the case where first doped semiconductor layer 110 includes Si, second semiconductor layer 112 may include SiGe to provide higher electrical conductivity than first doped semiconductor layer 110 thereunder. In an example implementation, second semiconductor layer 112 may be formed by initial epitaxial growth of semiconductor material within opening 108 (FIGS. 2, 3) before it is planarized (e.g., by chemical mechanical planarization (CMP)) to be substantially coplanar with an upper surface of substrate 102. In this case, the planarizing of second semiconductor layer 112 also may remove insulator layer 104 (FIGS. 1-3).

Forming second semiconductor layer 112 may include removing insulator layer 104 (FIGS. 1-3). Here, embodiments of the disclosure may include forming a pad insulator 114 on substrate 102 and second semiconductor layer 112. Pad insulator 114 may have the same composition as insulator layer 104 or may include other insulative materials. As an example, pad insulator 114 may include a pad nitride material (e.g., silicon nitride (SiN)). Although pad insulator 114 is shown in other FIGS. and discussed elsewhere herein, it is understood that insulator layer 104 may remain intact and be used in further implementations without significantly departing from the technical processes discussed herein.

Figure 5:
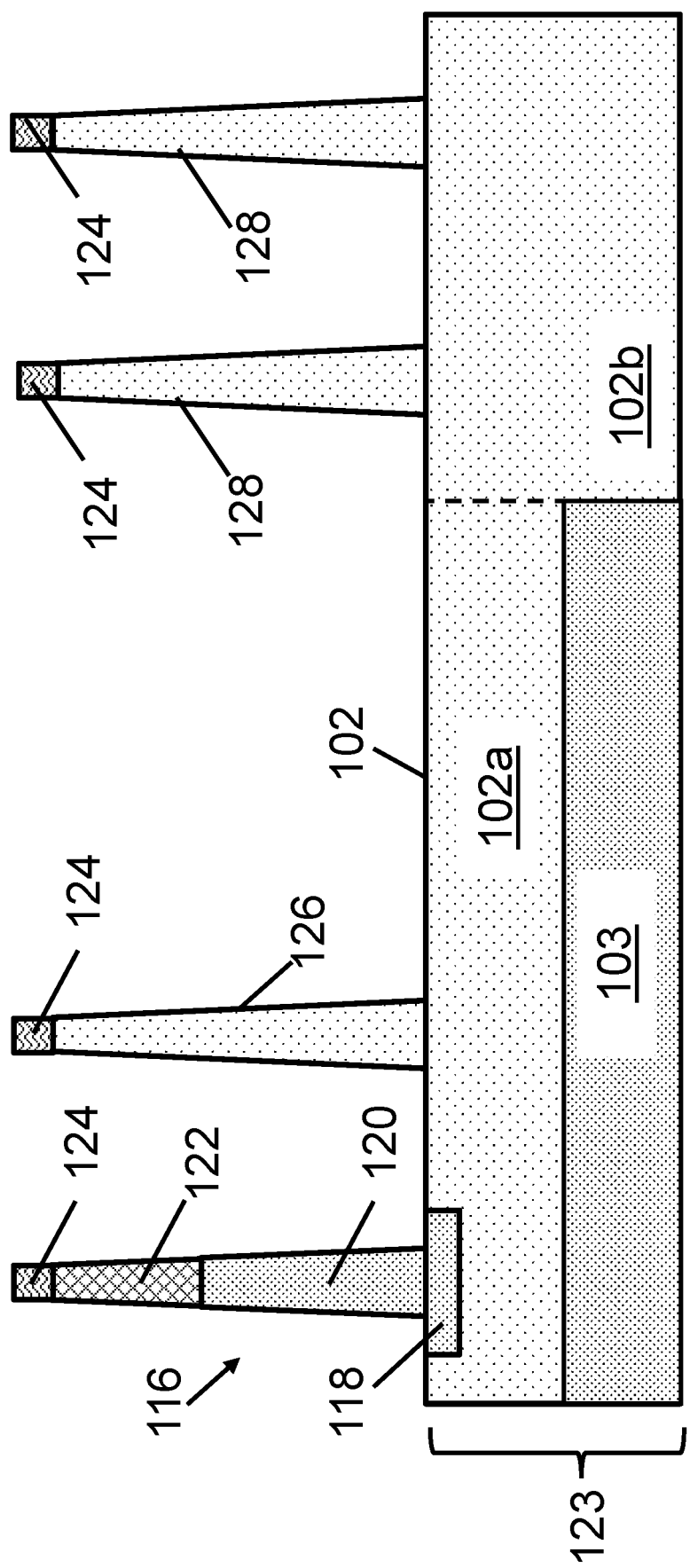
FIG. 5 depicts a cross-sectional view of forming a set of semiconductor fins according to embodiments of the disclosure.

FIG. 5 depicts further processing of the structure to form several semiconductor fins by removing selected portions of substrate 102 material to a predetermined depth. A mask (not shown) or similar material may be formed over pad insulator 114 at selected locations, and non-covered portions of substrate 102, doped semiconductor layers 110, 112, and pad insulator 114 may be removed (e.g., by etching such as RIE) to a predetermined depth and/or over a predetermined interval. The remaining substrate 102 may include, e.g., a doped area 118 as a remaining portion of first doped semiconductor layer 110. Other material(s) may remain intact as freestanding structures on and above substrate 102, e.g., due to the prior masking and/or non-etching of materials in selected locations. Removing portions of substrate 102, doped semiconductor layers 110, 112, and pad insulator 114 may form a first semiconductor fin 116 over bipolar transistor site 102a and doped area 118. The presence of doped area 118 of a particular doping type (e.g., p-type where a remainder of substrate 102 is doped n-type) may create a triple well stack 123 below first semiconductor fin 116. Triple well stack 123 may include an NPN configuration of doped semiconductor materials, i.e., deep well 103, substrate 102 over deep well 103, and doped area 118 over substrate 102.

First semiconductor fin 116 may include a lower portion 120 having a first doping polarity and concentration, and an upper portion 122 having the same doping polarity but a lower doping concentration than lower portion 120. In the eventual bipolar transistor structure, portions 120, 122 may define extrinsic and intrinsic base regions for a bipolar transistor, respectively. An insulative cap 124 may be on upper portion 122 of first semiconductor fin 116, e.g., to physically and electrically separate subsequently formed emitter and collector terminals of a bipolar transistor. Other portions of a bipolar transistor may be formed on, and/or may be coupled to, first semiconductor fin 116 in other processing phases.

In addition to first semiconductor fin 116, the removing of substrate 102 and materials thereon may also create a second semiconductor fin 126 on bipolar transistor site 102a of substrate 102. Due to the size and location of first doped semiconductor layer 110 (FIGS. 3, 4) discussed herein, second semiconductor fin 126 may not be on doped semiconductor layer 110, but instead may be on non-doped or lightly doped portions of bipolar transistor site 102a. In some cases, second semiconductor fin 126 may be distal to first semiconductor fin 116 in a direction that is out of plane with respect to the cross-sectional view(s) shown in FIG. 10. In such cases, it is possible for second semiconductor fin 126 to be substantially horizontally aligned with first semiconductor fin 116 along the axis extending perpendicularly from the plane of the page. Second semiconductor fin 126 initially may have the same doping polarity and/or concentration as substrate 102 (i.e., non-doped or lightly doped in the same polarity as portions 120, 122 of first semiconductor fin 116). Second semiconductor fin 126 may also include insulative cap 124 therein. Second semiconductor fin 126 may be distinguished from first semiconductor fin 116, e.g., due to being less highly doped but also being formed over bipolar transistor site 102a of substrate 102. The forming of second semiconductor fin 126 optionally may also produce a set of additional semiconductor fins 128 on CMOS site 102b of substrate 102. Additional semiconductor fins 128, moreover, may also include insulative cap(s) 124 thereon. Further processing may modify semiconductor fin(s) 116, 126 on bipolar transistor site 102*a* differently from additional semiconductor fins 128 on CMOS site 120*b*.

Figure 6:
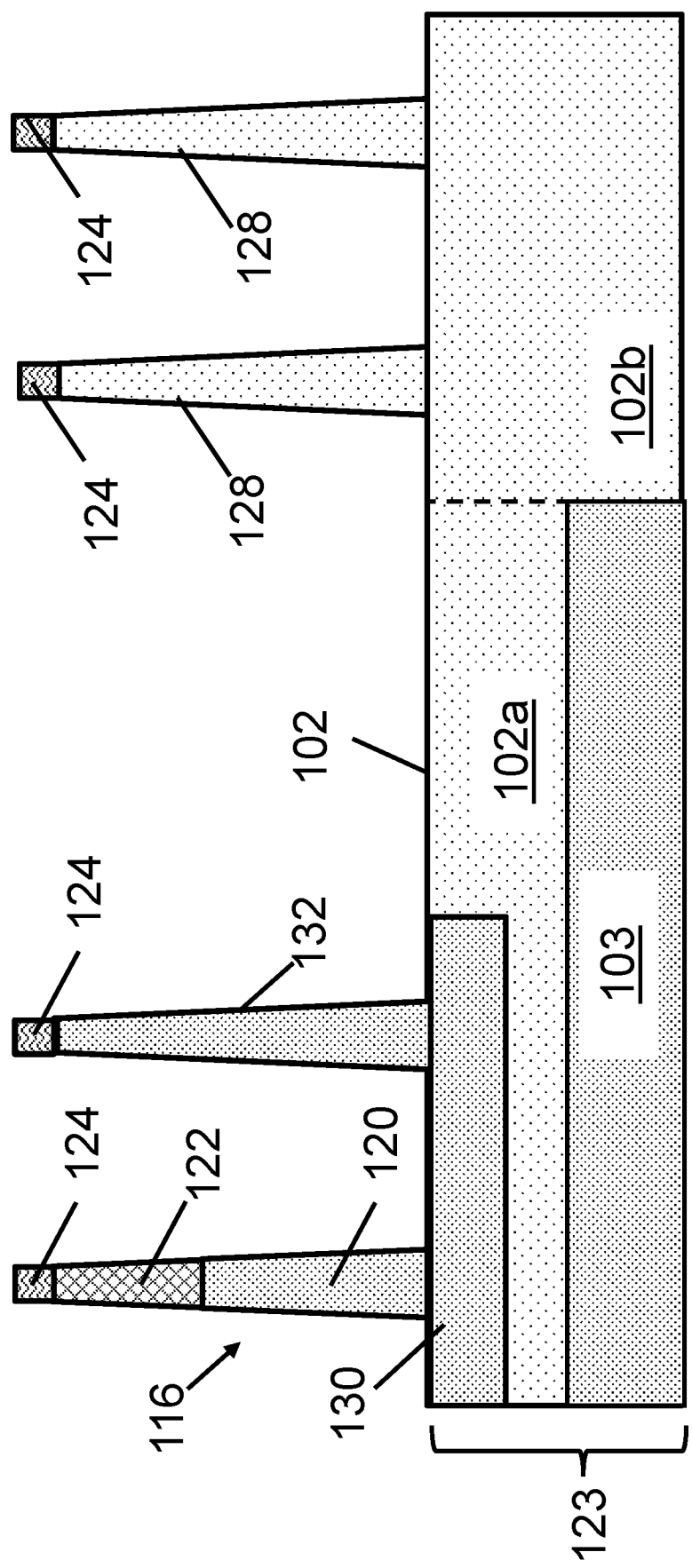
FIG. 6 depicts a cross-sectional view of forming a doped semiconductor layer within the substrate according to embodiments of the disclosure.

FIG. 6 depicts doping of various materials on and within bipolar transistor site 102*a*, e.g., to define conductive pathways to lower portion 120 of first semiconductor fin 116. Here, bipolar transistor site 102*a* may be doped independently of CMOS site 102*b*, e.g., by angled implantation and/or other processes to introduce dopants into only a portion of substrate 102. The additional doping may form, e.g., a doped semiconductor layer 130 within bipolar transistor site 102*a* and a doped second semiconductor fin 132 on bipolar transistor site 102*a*. In the case of angled implantation and/or other doping techniques implemented only on bipolar transistor site 102*a*, doped semiconductor layer 130 may define a conductive pathway from first semiconductor fin 116 to doped second semiconductor fin 132. This doping, however, does not also electrically couple fins 116, 132 to additional semiconductor fin(s) 128 and/or other elements on or within CMOS site 102*b*. In some cases, doped semiconductor layer 130 may be solely within bipolar transistor site 102*a* of substrate 102. Where applicable, the doping to form doped semiconductor layer 130 may be controlled such that a portion of substrate 102 remains vertically between deep well 103 and doped semiconductor layer 130. Thus, triple well stack 123 may remain present below semiconductor fins 116, 132. Each layer of triple well stack 123 may be independently biased to further control current flow through the eventual bipolar transistor structure.

Figure 7:
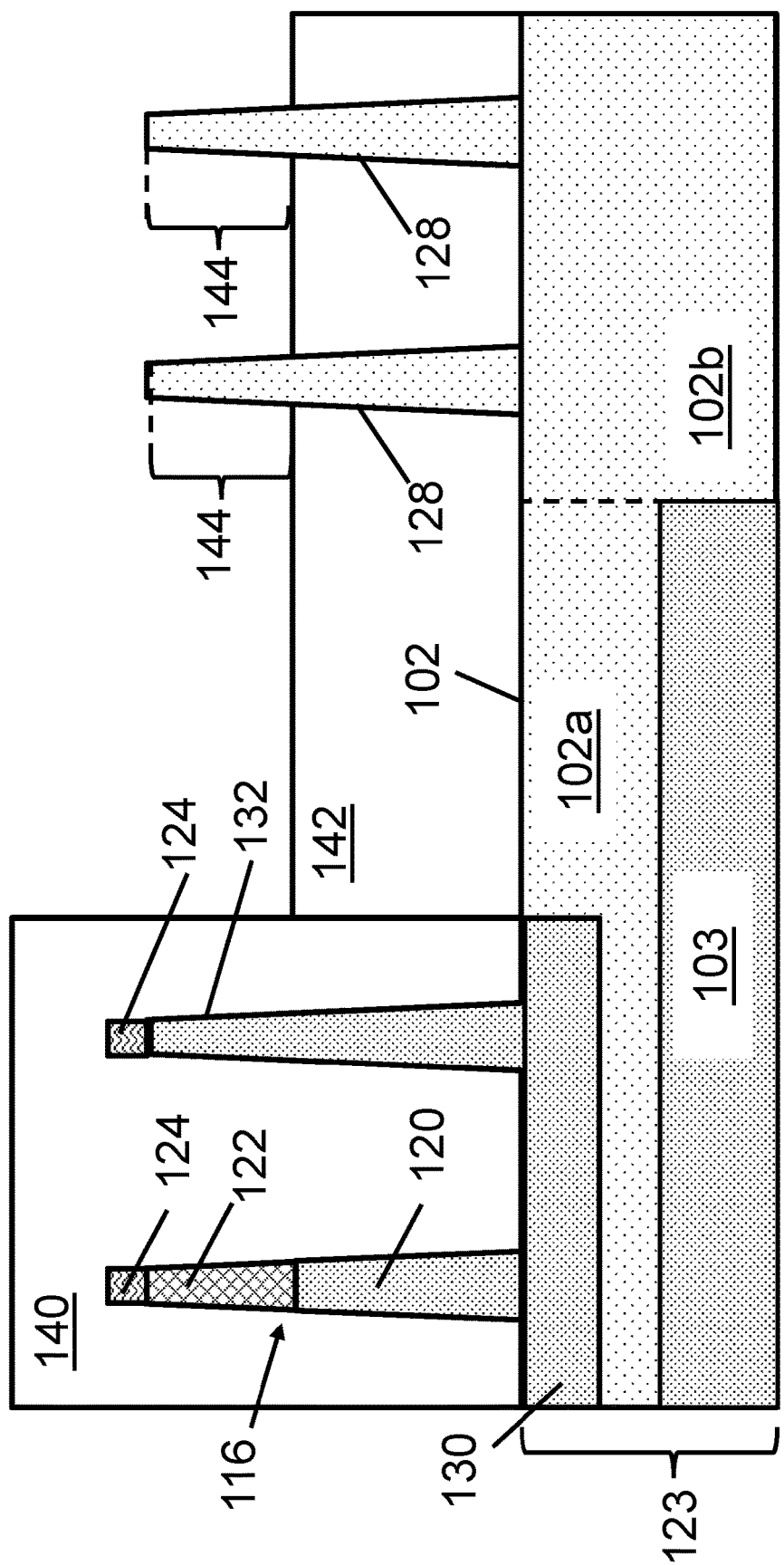
FIG. 7 depicts a cross-sectional view of forming overlying insulators over the semiconductor fins according to embodiments of the disclosure.
Figure 8:
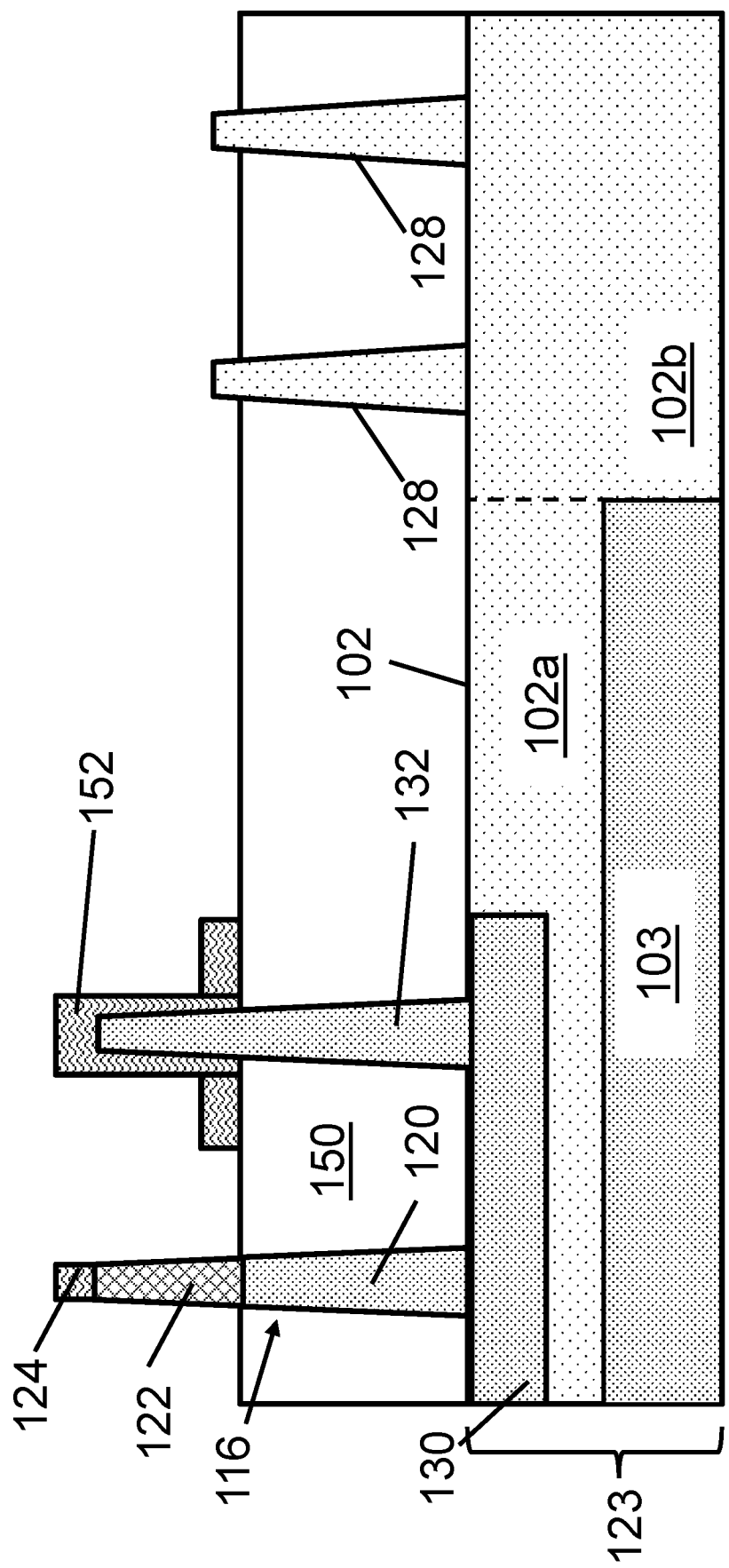
FIG. 8 depicts a cross-sectional view of covering a second semiconductor fin with insulator according to embodiments of the disclosure.

FIGS. 7 and 8 depict, in cases where additional semiconductor fins 128 are on CMOS site 102*b*, processing of additional semiconductor fins 128 without affecting semiconductor fins 116, 132 on bipolar transistor site 102*a*. As shown in FIG. 2, a first overlying insulator 140 may be formed over fins 116, 132 while a second overlying insulator 142 may be formed over additional semiconductor fins 128. First overlying insulator 140 and second overlying insulator 142 each may include any currently known or later developed insulative material, e.g., any of those discussed herein concerning insulator layer 104, insulative caps 124, and/or other similar materials.

First overlying insulator 140 may have a greater height above substrate 102 than second overlying insulator 142, e.g., by masking first overlying insulator 140 while partially recessing second overlying insulator 142. Alternatively, overlying insulators 140, 142 of different thickness can be created by any currently known or later developed process to form additional insulative material only over fins 116, 132 without forming such material over additional semiconductor fins 128. Additional fins 128 each may have an exposed upper portion 144 (FIG. 7 only) over second overlying insulator layer 142, whereas first overlying insulator 140 covers first semiconductor fin 116 and doped second semiconductor fin 132. Here, exposed upper portion(s) 144 of additional semiconductor fins 128 may be recessed (e.g., by silicon etch) such that additional semiconductor fins 128 have a reduced height as compared with fins 116, 132. The recessing of additional semiconductor fins 128 may be implemented, e.g., to prepare additional semiconductor fins 128 for gate metal formation and/or metal gate replacement in conventional FinFET processing.

Referring specifically to FIG. 8, continued processing may include recessing first overlying insulator 140 (FIG. 7) such that it has approximately the same height as second overlying insulator 142 (FIG. 7). The resulting region of insulative material may define a trench isolation (TI) region 150 for electrically isolating multiple structures (e.g., semiconductor fins 116, 128, 132) and components formed thereon from each other. After being formed, TI region 150 may have a height above substrate 102 that is approximately equal to the height of lower portion 120 of first semiconductor fin 116 above substrate 102. In alternative implementations, the height of TI region 150 above substrate 102 may differ from that of lower portion 120. To prevent additional material(s) from being formed on doped second semiconductor fin 132, an epitaxy blocking layer 152 (e.g., one or more insulative and/or masking materials) can be formed on doped second semiconductor fin 132 without being formed on any of fins 116, 128. Epitaxy blocking layer 152 may be formed, e.g., by forming a layer of insulative or masking material on TI 150 and other exposed surfaces and removing such material from fins 116, 128 but leaving the material intact on doped second semiconductor fin 132.

Figure 9:
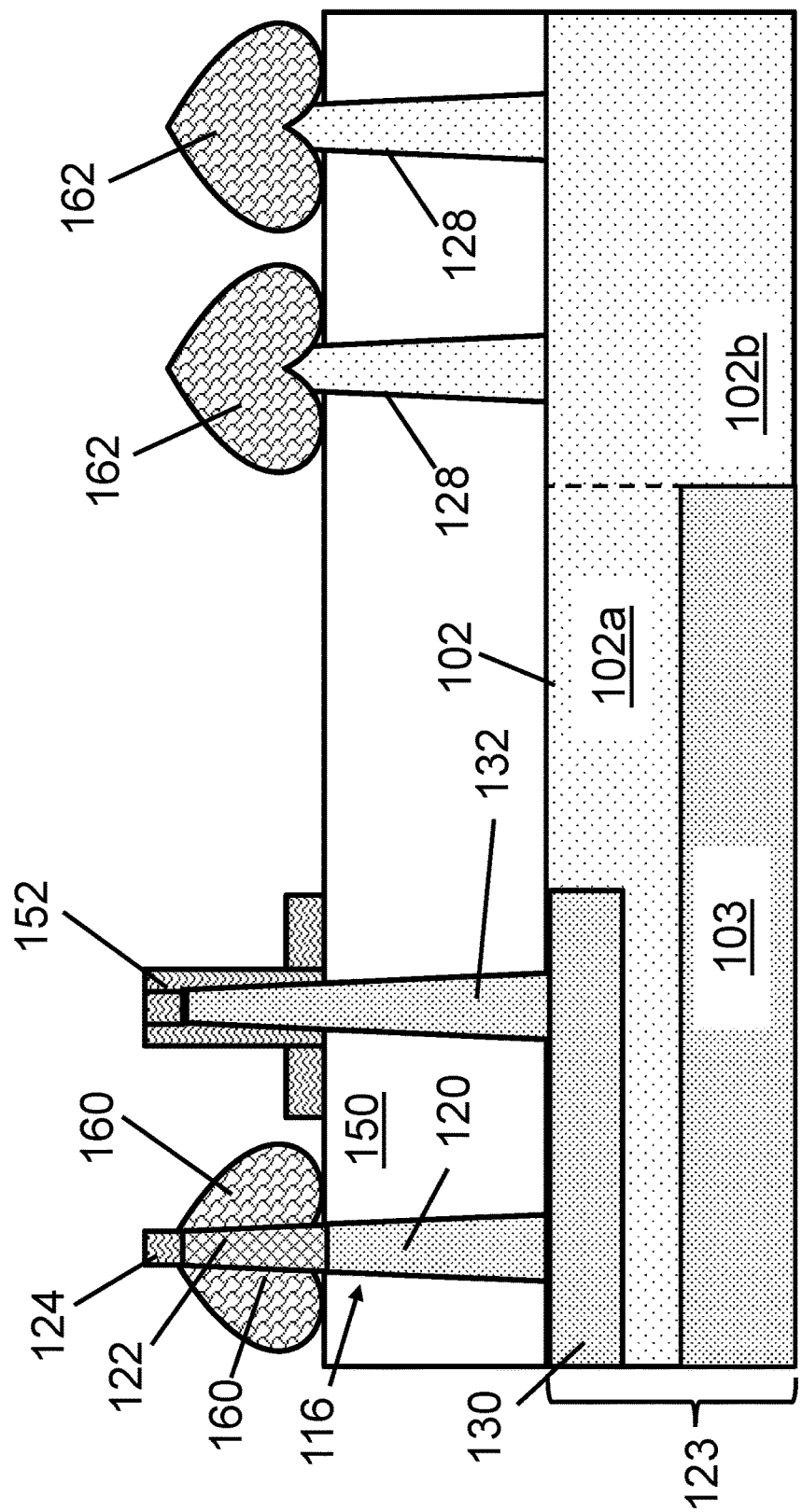
FIG. 9 depicts a cross-sectional view of forming an E/C material and doped semiconductor material on the semiconductor fins according to embodiments of the disclosure.

Turning to FIG. 9, further processing may include forming an emitter/collector (E/C) material 160 on first semiconductor fin 116, e.g., on exposed surfaces of upper portion 122. E/C material 160 may define all or part of the active bipolar transistor materials for emitter and collector terminals of a bipolar transistor structure. E/C material 160 may be formed on respective portions (e.g., sidewalls) of first semiconductor fin 116, e.g., by epitaxial growth or deposition of doped semiconductor material. E/C material 160 may include the same material composition as first semiconductor fin 116 (e.g., doped silicon phosphide (SiP)), but with an opposite doping type (e.g., they may be doped N type when upper portion 122 is doped P type or vice versa). E/C material 160 additionally or alternatively may include other electrically active semiconductor materials. E/C material 160 may be formed to a desired size, in part due to structural support by TI region 150 thereunder. As shown, a lower surface of E/C material 160 may rest upon an upper surface of TI region 150. In the case where E/C material 160 is formed by epitaxial growth, some portions of E/C material 160 may laterally abut portions of insulative cap 124. In this case, insulative cap 124 may prevent E/C material 160 on one side of first semiconductor fin 116 from touching and being electrically coupled to E/C material 160 on another side of first semiconductor fin 116. Epitaxy blocking layer 152 may prevent any semiconductive material (e.g., SiP) from similarly being formed on doped second semiconductor fin 132, e.g., by covering of any semiconductor surfaces where such material would otherwise be grown.

The forming of E/C material 160 may be implemented together (e.g., simultaneously) with the forming source/drain (S/D) material 162 on additional semiconductor fins 128 over CMOS site 102*b*. S/D material 162 may include the same material and/or similar material(s) to E/C material 160 (e.g., SiP or other doped semiconductor(s)) to form an electrical coupling to active material within additional semiconductor fins 128. S/D material 162 may be formed, e.g., by epitaxial growth of doped material on exposed surfaces of additional semiconductor fins 128. By being formed on additional semiconductor fins 128 over CMOS site 102*b*, S/D material 162 can be structurally separate (e.g., horizontally distal to) any active material(s) located over bipolar transistor site 102*a*. Further active components to additional semiconductor fin(s) 128 (e.g., gate contacts thereto) may be formed in different areas (e.g., cross-sectional planes) from those shown in FIG. 9 according to conventional processing.

Figure 10:
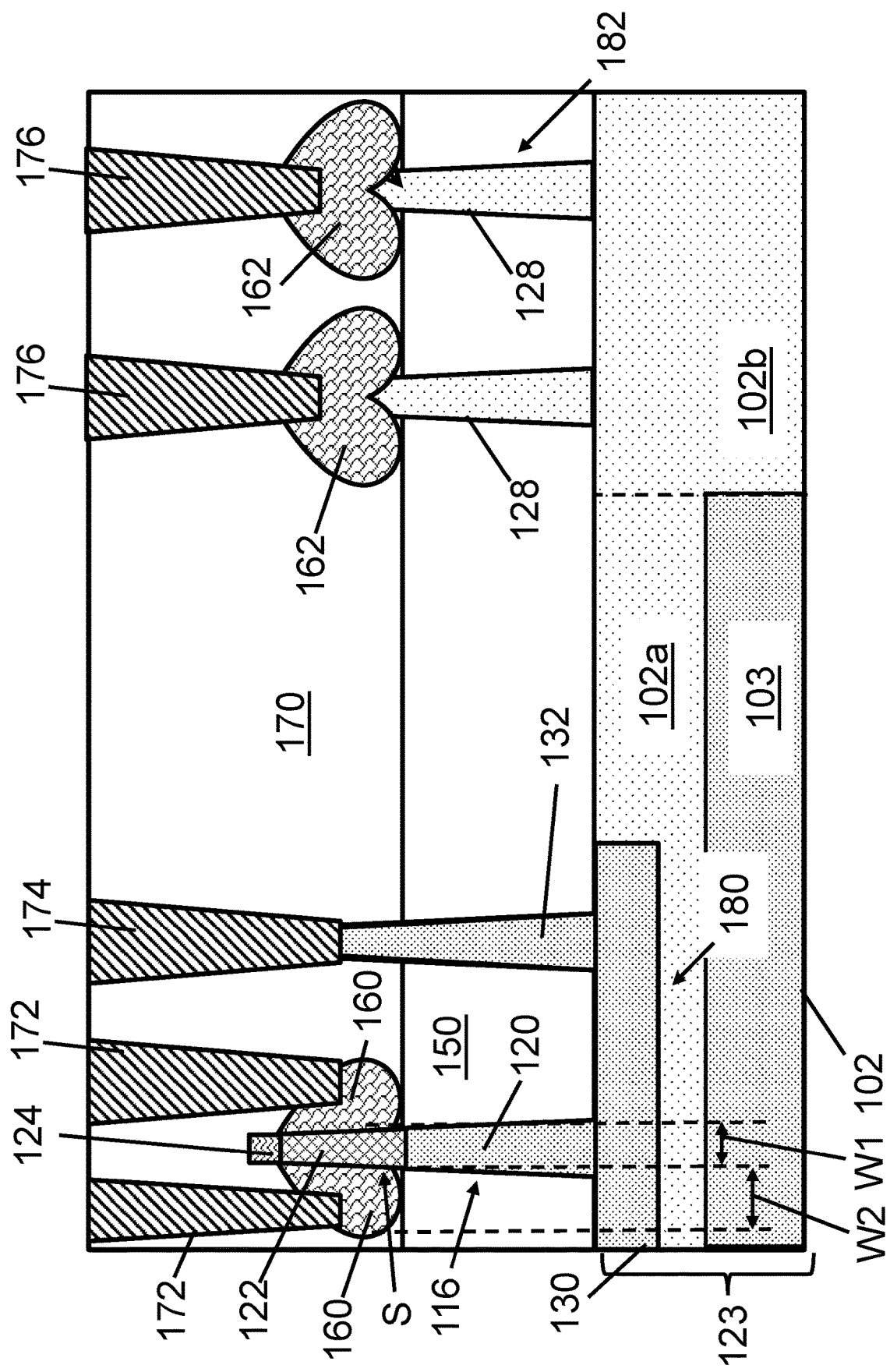
FIG. 10 depicts a cross-sectional view of forming contacts to a bipolar transistor structure on a semiconductor fin according to embodiments of the disclosure.

FIG. 10 depicts forming an inter-level dielectric (ILD) layer 170 over TI 150, semiconductor fins 116, 128, 132, etc., by deposition or other techniques of forming an insulative material on a structure. Additional metallization layers (not shown) may be formed on ILD layer 170 in subsequent processing during middle-of-line and/or back-end-of-line processing. ILD layer 170 may include any currently known or later developed insulative layer, e.g., those included within insulative cap(s) 124 and/or TI 150. Despite ILD layer 170 possibly having a similar or identical composition to such materials, it is formed separately from other insulative material and boundaries and/or physical interfaces between ILD layer 170 and other such materials may be present in the structure. To electrically couple E/C material 160 to overlying layers and/or structures, a set of E/C contacts 172 may be formed to E/C material 160 and within ILD layer 170. E/C contact(s) 172 may include any currently known or later developed material to form a conductive electrical pathway, e.g., tungsten (W), copper (Cu), aluminum (Al), etc. E/C contacts 172 may additionally include refractory metal liners (not shown) positioned alongside ILD layer 170 to prevent electromigration degradation, shorting to other components, etc. Some portions of E/C material 160 may include silicide regions (i.e., portions of semiconductor that are annealed in the presence of an overlying conductor) to increase the electrical conductivity at their physical interface with contact(s) 172, where applicable.

Although E/C material 160 may define emitter and/or collector terminals for a bipolar transistor on first semiconductor fin 116, doped semiconductor layer 130 and second doped semiconductor fin 132 may define portions of a base terminal for the bipolar transistor. That is, multiple semiconductor fins 116, 132 each may include and/or define portions of one bipolar transistor. As a precursor to ILD layer 170 formation, epitaxy blocking layer 152 (FIG. 9) may be removed (e.g., by selective etching) to expose second doped semiconductor fin 132. ILD layer 170 thus may be formed on the re-exposed surfaces of doped second semiconductor fin 132. A base contact 174 to second doped semiconductor fin 132 may be formed within ILD layer 170, e.g., by removing a portion of ILD 170 to form an opening and filling the opening with conductive material(s). In other cases, epitaxy blocking layer 152 may remain intact within ILD layer 170 and may be removed during base contact 174 formation. Base contact 174 may include any material(s) discussed herein regarding E/C contact(s) 172, and moreover may include refractory metal liners adjacent ILD layer 170. Where applicable, additional contacts 176 to S/D material(s) 162 may be formed within ILD layer 170 (e.g., simultaneously with) E/C contact 172 and base contact 174 formation.

Embodiments of the disclosure provide a bipolar transistor structure 180 in which active material of a bipolar transistor is defined within at least first semiconductor fin 116. In bipolar transistor structure 180, doped semiconductor layer 130 is within substrate 102 and coupled to base contact 174. Doped semiconductor layer 130 may be coupled to base contact 174 through doped second semiconductor fin 132, or alternatively may be directly coupled to base contact 174 without additional conductive material (s). First semiconductor fin 116 may be on doped semiconductor layer 130, and may have a predetermined doping type (e.g., P-type doping).

E/C material 160 (including, e.g., doped semiconductor material such as SiP) may be on first semiconductor fin 116 (e.g., by being adjacent a sidewall S of upper portion 122). E/C material 160 may have a second doping type that is opposite the doping type of first semiconductor fin 116 (e.g., N-type doping). A lateral width W1 of first semiconductor fin 116 at a widest portion (e.g., base) thereof may be less than a corresponding lateral width W2 of E/C material 160 at a widest portion thereof due to the forming of E/C material 160 by epitaxial growth as discussed herein. This difference in lateral horizontal widths W1, W2 also may arise from defining active base material(s) within first semiconductor fin 116. In some cases, upper portion 122 of first semiconductor fin 116 may have a higher concentration of dopants than lower portion 120, thereof. In this case, upper portion 122 may define an intrinsic base region while lower portion 120 defines a more highly conductive extrinsic base region. Insulative cap 124 optionally may be on first semiconductor fin 116 to prevent electrical shorting between multiple regions of E/C material 160. TI region 150 may be on substrate 102 and above doped semiconductor layer 130, e.g., such that a lower surface of E/C material 160 rests on TI 150. Additionally, one or more fin-type field effect transistors (FinFETs) 182 may be on substrate 102 over CMOS site 102*b* without being electrically coupled to bipolar transistor structure 180.

Advantages of the disclosure include the ability to provide bipolar transistor structure 180 and FinFETs 182 on one substrate 102 (e.g., at different sites 102*a*, 102*b* thereof). In addition to reducing the surface area required to form multiple types of transistors, embodiments of the disclosure allow various FinFET processing techniques to be used to form bipolar transistor structure 180. Embodiments of the disclosure allow continued use of highly doped extrinsic base material by forming such material in semiconductor fins 116, 132, e.g., to define intrinsic and extrinsic base regions and/or to define a coupling between doped semiconductor layer 130 to base contact 174 through doped second semiconductor fin 132. Bipolar transistor structure(s) 180 may be operationally identical to other bipolar transistor structures, and moreover may provide a smaller horizontal width (e.g., horizontal width W1) than conventional bipolar transistor structures.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A bipolar transistor structure comprising:
    a triple well stack, including:
        a deep well region,
        a substrate portion over the deep well region, and
        a doped semiconductor layer over the substrate portion and coupled to a base contact, wherein the deep well region has a same doping type as the doped semiconductor layer;
    a first semiconductor fin on the doped semiconductor layer of the triple well stack, the first semiconductor fin having a first doping type;
    an emitter/collector (E/C) material on a sidewall of an upper portion of the first semiconductor fin, the E/C material having a second doping type opposite the first doping type, wherein the E/C material is coupled to an E/C contact, wherein a lateral width of the E/C material from an outside surface of the E/C material to the sidewall of the first semiconductor fin is greater than a lateral width of the first semiconductor fin; and
    a second semiconductor fin on the doped semiconductor layer of the triple well stack and below the base contact, wherein the second semiconductor fin extends vertically continuously from the doped semiconductor layer of the triple well stack to the base contact, and an upper surface of the second semiconductor fin physically contacts a lower surface of the base contact.

2. The bipolar transistor structure of claim 1, wherein the first semiconductor fin includes:
    a lower portion on the doped semiconductor layer of the triple well stack, the lower portion having a first dopant concentration; and
    an upper portion on the lower portion and adjacent the E/C material, the upper portion having a second dopant concentration that is less than the first dopant concentration.

3. The bipolar transistor structure of claim 1, further comprising an insulative cap on the first semiconductor fin.

4. The bipolar transistor structure of claim 3, wherein the E/C material includes a first E/C layer on a first sidewall of the first semiconductor fin, and a second E/C layer on a second sidewall of the first semiconductor fin, wherein the insulative cap is horizontally between and includes sidewalls laterally abutting the first E/C layer and the second E/C layer.

5. The bipolar transistor structure of claim 1, further comprising an insulator layer on the doped semiconductor layer of the triple well stack, wherein the E/C material is over the insulator layer.

6. The bipolar transistor structure of claim 1, wherein the E/C material includes silicon phosphide (SiP).

7. A bipolar transistor structure comprising:
    a triple well stack, including:
        a deep well region,
        a substrate portion over the deep well region, and
        a doped semiconductor layer over the substrate portion and coupled to a base contact, wherein the deep well region has a same doping type as the doped semiconductor layer;
    a first semiconductor fin on the doped semiconductor layer of the triple well stack, the first semiconductor fin including:
        a lower portion on the doped semiconductor layer, the lower portion having a first dopant concentration, and
        an upper portion on the lower portion, the upper portion having a second dopant concentration that is less than the first dopant concentration;
    an emitter/collector (E/C) material on a sidewall of the upper portion of the first semiconductor fin, wherein a lateral width of the E/C material from an outside surface of the E/C material to the sidewall of the first semiconductor fin is greater than a lateral width of the first semiconductor fin;
    an E/C contact on the E/C material;
    a second semiconductor fin on the doped semiconductor layer of the triple well stack, wherein the second semiconductor fin has a same doping type as the doped semiconductor layer; and
    a base contact on the second semiconductor fin, wherein the second semiconductor fin extends vertically continuously from the doped semiconductor layer of the triple well stack to the base contact, and an upper surface of the second semiconductor fin physically contacts a lower surface of the base contact.

8. The bipolar transistor structure of claim 7, further comprising an insulative cap on the first semiconductor fin.

9. The bipolar transistor structure of claim 8, wherein the E/C material includes a first E/C layer on a first sidewall of the first semiconductor fin, and a second E/C layer on a second sidewall of the first semiconductor fin, wherein the insulative cap is horizontally between and includes sidewalls laterally abutting the first E/C layer and the second E/C layer.

10. The bipolar transistor structure of claim 7, further comprising an insulator layer on the doped semiconductor layer of the triple well stack, wherein the E/C material is over the insulator layer.

11. The bipolar transistor structure of claim 7, further comprising a fin-type field effect transistor (FinFET) device on the substrate and horizontally distal to the doped semiconductor layer.

12. A method of forming a bipolar transistor structure, the method comprising:
forming a triple well stack, including:
forming a deep well region,
forming a substrate portion over the deep well region, and
forming a doped semiconductor layer over the substrate portion and coupled to a base contact, wherein the deep well region has a same doping type as the doped semiconductor layer;
forming a first semiconductor fin on the doped semiconductor layer of the triple well stack and coupled to a base contact, the first semiconductor fin having a first doping type; and
forming an emitter/collector (E/C) material on a sidewall of an upper portion of the first semiconductor fin, the E/C material having a second doping type opposite the first doping type, wherein the E/C material is coupled to an E/C contact, wherein a lateral width of the E/C material from an outside surface of the E/C material to the sidewall of the first semiconductor fin is greater than a lateral width of the first semiconductor fin; and
forming a second semiconductor fin on the doped semiconductor layer of the triple well stack and below the base contact, wherein the second semiconductor fin extends vertically continuously from the doped semiconductor layer of the triple well stack to the base contact, and an upper surface of the second semiconductor fin physically contacts a lower surface of the base contact.

13. The method of claim 12, wherein forming the first semiconductor fin includes:
forming a lower portion of the first semiconductor fin on the doped semiconductor layer, the lower portion having a first dopant concentration; and
forming an upper portion of the first semiconductor fin on the lower portion of the first semiconductor fin and adjacent the E/C material, the upper portion having a second dopant concentration that is less than the first dopant concentration.

14. The method of claim 12, further comprising:
forming the base contact to the second semiconductor fin; and
forming an E/C contact on the E/C material.

15. The method of claim 12, further comprising forming an insulative cap on the first semiconductor fin and adjacent a portion of the E/C material.

16. The method of claim 12, further comprising forming an insulator layer on the doped semiconductor layer of the triple well stack, wherein the E/C material is formed over the insulator layer.

17. The method of claim 15, wherein forming the E/C material includes:
a first E/C layer on a first sidewall of the first semiconductor fin;
and a second E/C layer on a second sidewall of the first semiconductor fin, wherein the insulative cap is horizontally between and includes sidewalls laterally abutting the first E/C layer and the second E/C layer.

18. The bipolar transistor structure of claim 7, wherein the E/C material includes silicon phosphide (SiP).

19. The bipolar transistor structure of claim 1, wherein the substrate portion includes an upper surface substantially horizontally aligned with an upper surface of the doped semiconductor layer.

20. The bipolar transistor structure of claim 7, wherein the substrate portion includes an upper surface substantially horizontally aligned with an upper surface of the doped semiconductor layer.

* * * * *